United States Patent
Onizuka et al.

(10) Patent No.: US 7,876,162 B2
(45) Date of Patent: Jan. 25, 2011

(54) AMPLIFIER AND RADIO

(75) Inventors: Kohei Onizuka, Tokyo (JP); Masahiro Hosoya, Kawasaki (JP); Hiroaki Ishihara, Kawasaki (JP); Shoji Otaka, Yokohama (JP); Osamu Watanabe, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/558,807

(22) Filed: Sep. 14, 2009

(65) Prior Publication Data
US 2010/0225397 A1    Sep. 9, 2010

(30) Foreign Application Priority Data
Mar. 6, 2009    (JP)    ............... 2009-054032

(51) Int. Cl.
*H03F 3/14*    (2006.01)
(52) U.S. Cl. .................. 330/307; 330/276; 330/262
(58) Field of Classification Search .......... 330/307, 330/276, 262
See application file for complete search history.

(56) References Cited

U.S. PATENT DOCUMENTS

| | | | | |
|---|---|---|---|---|
| 5,066,925 | A * | 11/1991 | Freitag ................. | 330/269 |
| 5,223,800 | A * | 6/1993 | Karsten et al. ........... | 330/54 |
| 6,525,618 | B2 * | 2/2003 | Wood ..................... | 331/57 |
| 6,816,012 | B2 | 11/2004 | Aoki et al. | |
| 6,856,199 | B2 * | 2/2005 | Komijani et al. .......... | 330/276 |
| 7,515,775 | B1 * | 4/2009 | Kucharski et al. ......... | 385/1 |

FOREIGN PATENT DOCUMENTS

| | | |
|---|---|---|
| JP | 2005503679 | 2/2005 |
| WO | 0231967 | 4/2002 |

* cited by examiner

*Primary Examiner*—Patricia Nguyen
(74) *Attorney, Agent, or Firm*—Turocy & Watson, LLP

(57) ABSTRACT

An amplifier includes: a substrate; first to fourth amplifying units arranged on the substrate and each having first and second terminals, and each amplifying first and second signals to generate first and second amplified signals; a first inductive line arranged on the substrate, connecting the first terminal of the first amplifying unit and the first terminal of the second amplifying unit, and having a linear portion and a bending portion; a second inductive line arranged on the substrate, connecting the second terminal of the second amplifying unit and the first terminal of the third amplifying unit, and having a linear portion and a bending portion; a third inductive line arranged on the substrate, connecting the second terminal of the third amplifying unit and the first terminal of the fourth amplifying unit, and having a linear portion and a bending portion; a fourth inductive line arranged on the substrate, connecting the second terminal of the fourth amplifying unit and the second terminal of the first amplifying unit, and having a linear portion and a bending portion; and a fifth inductive line which establishes magnetic field coupling with the first to fourth inductive lines, and has third and fourth terminals, combines the plurality of the first amplified signals amplified to output the first combined signal from the third terminal, and combines the plurality of the second amplified signals to output the second combined signal from the fourth terminal.

12 Claims, 10 Drawing Sheets

AMPLIFIER AND RADIO

CROSS-REFERENCE TO RELATED APPLICATIONS

This application is based upon and claims the benefit of priority from the prior Japanese Patent Application No. 2009-054032, filed on Mar. 6, 2009; the entire contents of which are incorporated herein by reference.

BACKGROUND OF THE INVENTION

1. Field of the Invention

The present invention relates to an amplifier and a radio.

2. Description of the Related Art

Conventionally, there has been known an amplifier in which a plurality of push-pull amplifiers are connected to each other in a ring shape for amplifying electric power (see, for example, JP-A 2005-503679 (KOHYO)). In this amplifier, inductive conductors having a linear shape are used for connecting the push-pull amplifiers, and these inductive conductors form an output transformer. With this output transformer, it is possible to perform combining of output power and trans forming an impedance, to thereby realize a high-output, high-frequency amplifier.

In the aforementioned technique, sometimes the inductive conductor is extended to correspond to a necessary inductance for circuit operation. However, it often happens that the size of the entire transformer is increased corresponding to the extension of the inductive conductor, and the entire circuit area is enlarged.

BRIEF SUMMARY OF THE INVENTION

An object of the present invention is to provide an amplifier and a radio capable of increasing an inductance without enlarging the circuit scale thereof.

An amplifier according to one aspect of the present invention includes: a substrate; first to fourth amplifying units arranged on the substrate and each having first and second terminals, and each amplifying first and second signals to generate first and second amplified signals; a first inductive line arranged on the substrate, connecting the first terminal of the first amplifying unit and the first terminal of the second amplifying unit, and having a linear portion and a bending portion; a second inductive line arranged on the substrate, connecting the second terminal of the second amplifying unit and the first terminal of the third amplifying unit, and having a linear portion and a bending portion; a third inductive line arranged on the substrate, connecting the second terminal of the third amplifying unit and the first terminal of the fourth amplifying unit, and having a linear portion and a bending portion; a fourth inductive line arranged on the substrate, connecting the second terminal of the fourth amplifying unit and the second terminal of the first amplifying unit, and having a linear portion and a bending portion; and a fifth inductive line which establishes magnetic field coupling with the first to fourth inductive lines, and has third and fourth terminals, combines the plurality of the first amplified signals amplified to output the first combined signal from the third terminal, and combines the plurality of the second amplified signals to output the second combined signal from the fourth terminal.

A radio according to one aspect of the present invention includes: a transforming unit converting an inputted signal into a signal having a frequency for communication; and the above-described amplifier which amplifies the signal converted in the converting unit.

DETAILED DESCRIPTION OF THE INVENTION

First Embodiment

Hereinafter, a first embodiment of the present invention will be described in detail with reference to the drawings.

Figure 1:
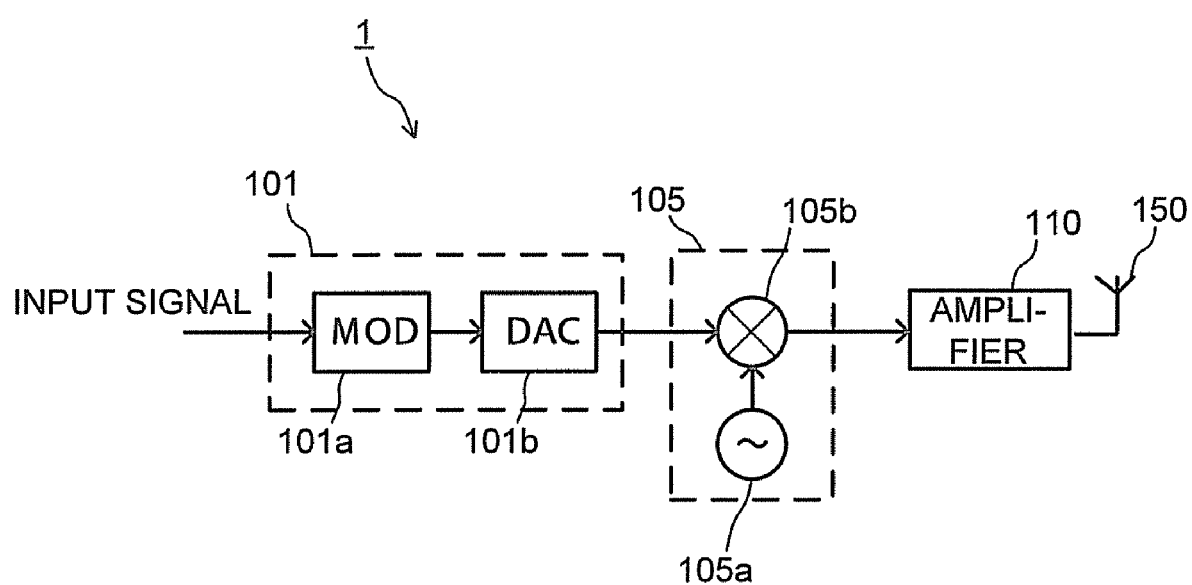
FIG. 1 is a block diagram showing a radio 1 according to a first embodiment.

As shown in FIG. 1, a radial according to the first embodiment includes a transmission signal generating unit 101, a frequency converting unit 105, an amplifier 110, and an antenna 150.

The transmission signal generating unit 101 generates a signal to be transmitted to a not-shown radio as a communication partner. The transmission signal generating unit 101 includes, for example, a modulator (MOD) 101a and a DAC (Digital to Analog Converter) 101b.

The modulator 101a modulates an inputted digital signal by a predetermined modulation method.

The DAC 101b converts the digital signal modulated in the modulator 101a into an analog signal.

The frequency converting unit 105 includes an oscillator 105a and a mixer 105b.

The oscillator 105a generates a local signal for converting an analog signal outputted from the transmission signal generating unit 101 into a signal having a transmission frequency.

The mixer 105b mixes the local signal generated in the oscillator 105a with the analog signal converted in the DAC 101b.

The amplifier 110 amplifies the signal having a transmission frequency generated in the transmission signal generating unit 101 to predetermined electric power. The signal amplified in the amplifier 110 is transmitted to a radio as a communication partner via the antenna 150.

Figure 2:
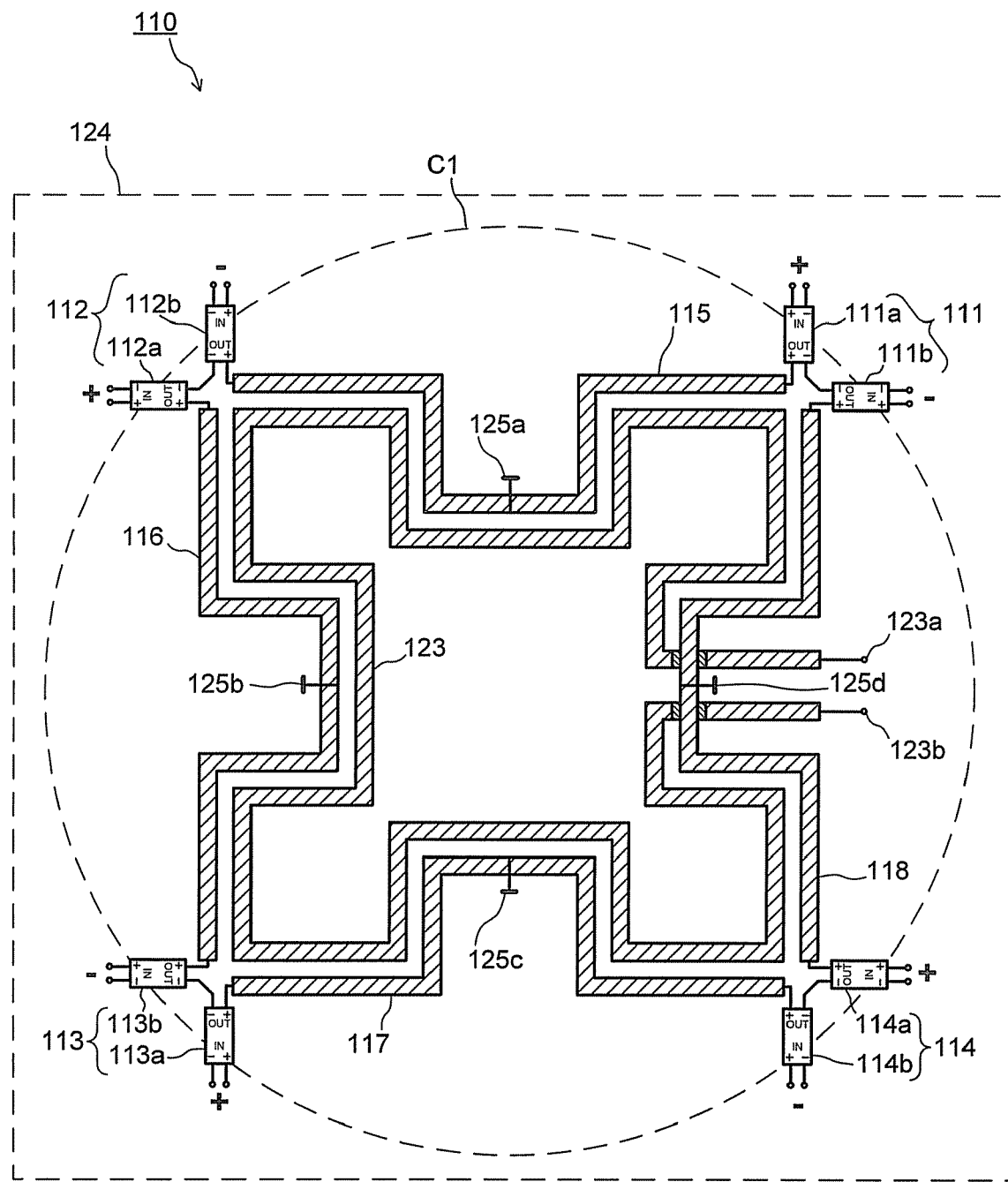
FIG. 2 is a diagram showing an amplifier 110 included in the radio 1.

As shown in FIG. 2, the amplifier 110 includes a plurality of gain stages 111 to 114, first conductors having inductivity (hereinafter referred to as first inductive conductors) 115 to 118, a second conductor having inductivity (hereinafter referred to as a second inductive conductor) 123, and DC power supply VDDs 125a to 125d.

Here, "having inductivity" means to have a characteristic to operate as an inductor when a predetermined alternative current (high frequency) is applied.

The elements forming the amplifier 110 are disposed on an upper face of a circuit board 124 formed of silicon for example.

On the circuit board 124, after the gain stages 111 to 114, the first inductive conductors 115 to 118 and the second inductive conductor 123 which constitute the amplifier 110 are formed, an upper face thereof is coated with an insulating resin so as to cover the amplifier 110. Note that dashed lines denoting the circuit board 124 in the diagram virtually denote an area where the amplifier 110 is arranged on the circuit board 124, and do not limit the shape and the size of the circuit board 124.

On the circuit board 124, there may be arranged not only the gain stages 111 to 114, the first inductive conductors 115 to 118, and the second inductive conductor 123, but wirings for connecting the gain stages 111 to 114 and the transmission signal generating unit 101 and/or the frequency converting unit 105. Further, the transmission signal generating unit 101 and/or the frequency converting unit 105 may be arranged on the circuit board 124.

The gain stages 111 to 114 are arranged in a distributed manner on the circumference of a virtual circle C1 on the circuit board 124. Incidentally, this embodiment describes an example in which the four gain stages 111 to 114 are arranged on the circuit board 124, but the number of gain stages just needs to be two or more. The gain stages 111 to 114 respectively have pairs of sub-gain stages 111a, Mb to 114a, 114b.

The sub-gain stages 111a, 111b each have a transistor, and function in their entirety as a push-pull amplifier. The sub-gain stages 111a, 111b each have positive and negative input terminals and output terminals. Negative output terminals of the sub-gain stages 111a, 111b are connected electrically to each other. Similarly, negative output terminals of the sub-gain stages 112a, 112b . . . 114a, 114b are connected electrically to each other.

Positive output terminals of the sub-gain stage 111a and the sub-gain stage 112b are connected to each other by the first inductive conductor 115. Similarly, respective positive output terminals of the sub-gain stage 112a and the sub-gain stage 113b . . . the sub-gain stages 114a and the sub-gain stages 111b are connected to each other by the first inductive conductors 116 to 118 respectively.

The sub-gain stages 111a, 111b to 114a, 114b and the first inductive conductors 115 to 118 form a substantially square shape as a whole. The sub-gain stages 111a, 111b to 114a, 114b are arranged at vertexes of this square, and the first inductive conductors 115 to 118 are arranged on sides of this square. A closed loop is formed by the electrical connection of the negative output terminals of the sub-gain stages 111a, 111b to 114a, 114b and the first inductive conductors 115 to 118. Incidentally, it is desirable that the sub-gain stages 111a, Mb to 114a, 114b have gains equal to each other.

The DC power supply VDD 125a is arranged at a substantially middle point of the first inductive conductor 115, and supplies power supply voltages of the sub-gain stage 111a and the sub-gain stage 112b to the first inductive conductor 115.

Similarly, the DC power supply VDDs 125b to 125d are arranged respectively at substantially middle points of the first inductive conductor 116 to the first inductive conductor 118, and supply power supply voltages of the sub-gain stage 112a and the sub-gain stage 113b . . . the sub-gain stage 114a and the sub-gain stage 111b to the inductive conductors 116 to 118 respectively. Incidentally, it is desirable that the voltage values of the DC power supply VDDs 125a to 125d are equal to each other.

The first inductive conductors 115 to 118 form first to fourth inductive lines. The first inductive conductors 115 to 118 function as a primary side wiring of an output transformer which combines output power of the gain stages 111 to 114. It is desirable that all the inductance values of the first inductive conductors 115 to 118 are equal.

The second inductive conductor 123 function as a secondary side wiring of the output transformer for the gain stages 111 to 114. By this combining of electric power, a signal with combined power is outputted between output terminals 123a, 123b to which end portions of the second inductive conductor 123 are connected. The second inductive conductor 123 is arranged inside the closed loop formed by the first inductive conductors 115 to 118. The shape of the second inductive conductor 123 is substantially the same as that of the first inductive conductors 115 to 118 correspondingly.

Next, using FIG. 3, the structures of the first inductive conductors 115 to 118 will be described in detail. Incidentally, the second inductive conductor 123 is omitted in FIG. 3 for clarity of description.

Figure 3:
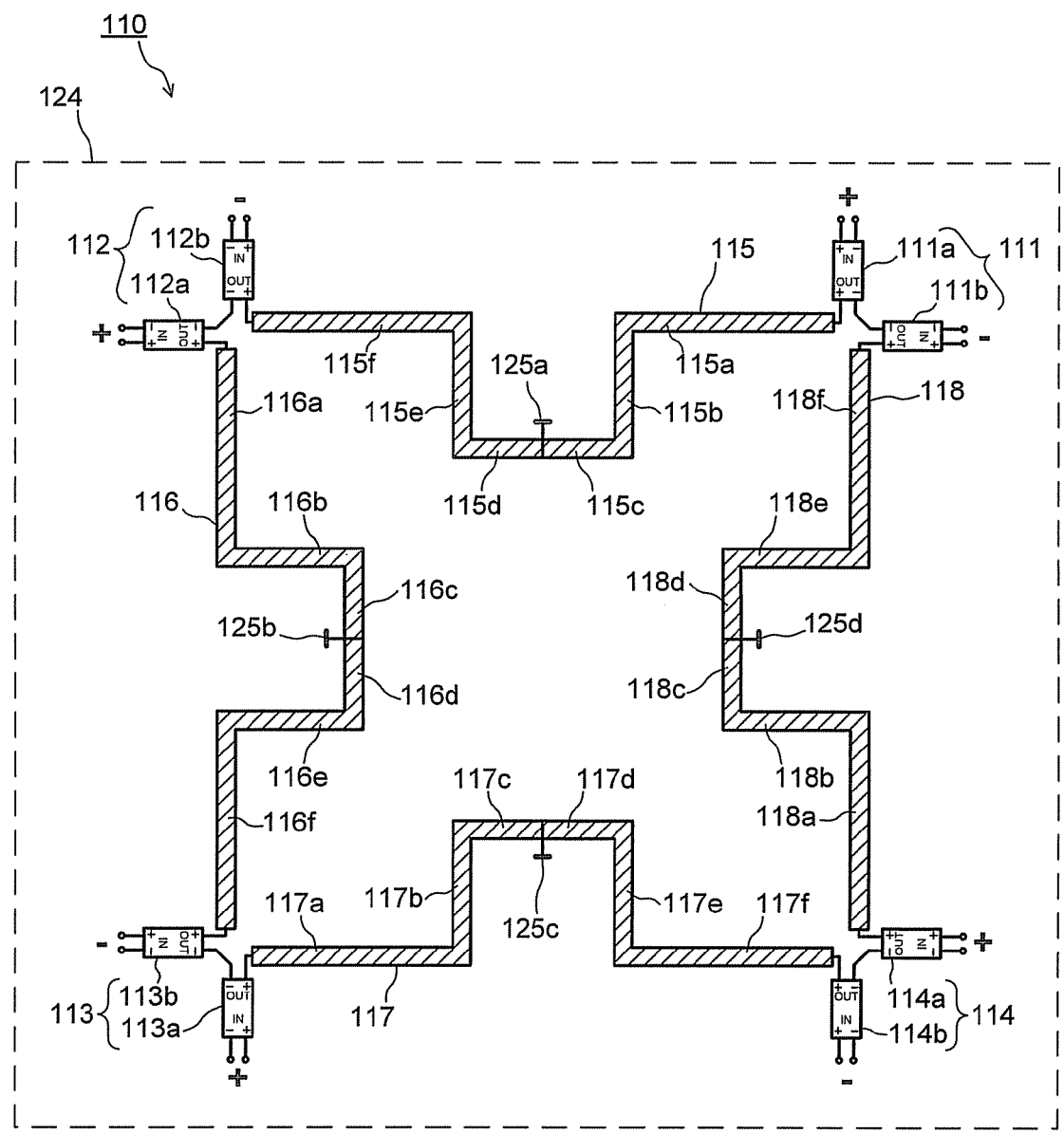
FIG. 3 is a schematic diagram showing first inductive conductors 115 to 118.

As shown in FIG. 3, the first inductive conductor 115 is formed by a first conductor portion 115a to a sixth conductor portion 115f connected to each other, which each have a linear shape.

Similarly, the first inductive conductor 116 is formed by a first conductor portion 116a to a sixth conductor portion 116f connected to each other. The first inductive conductor 117 is formed by a first conductor portion 117a to a sixth conductor portion 117f connected to each other. The first inductive conductor 118 is formed by a first conductor portion 118a to a sixth conductor portion 118f connected to each other.

In the first inductive conductor 115, the first conductor portion 115a forms a first linear portion. Further, the sixth conductor portion 115f forms a second linear portion. The first conductor portion 115a has one end connected to the positive output terminal of the sub-gain stage 111a. The sixth conductor portion 115f has one end connected to the positive output terminal of the sub-gain stage 112b. The first conductor portion 115a and the sixth conductor portion 115f are arranged along one side of the virtual square on the circuit board 124. Here, "along one side" refers to be substantially in parallel to one side of the virtual square.

The second conductor portion 115b forms a third linear portion. The fifth conductor portion 115e forms a fourth linear portion. The third conductor portion 115c and the fourth conductor portion 115d form a fifth linear portion. That is, the second conductor portion 115b to the fifth conductor portion 115e are a bending portion. The second conductor portion 115b to the fifth conductor portion 115e form a recessed portion bending inward of the virtual square. That is, the second conductor portion 115b and the fifth conductor portion 115e bend substantially orthogonally inward of the virtual square from the first conductor portion 115a and the sixth conductor portion 115f respectively, and are arranged with a predetermined line length. Further, the third conductor portion 115c and the fourth conductor portion 115d connect bending end portions of the second conductor portion 115b and the fifth conductor portion 115e to each other.

The third conductor portion 115c and the fourth conductor portion 115d share one end with each other, and are connected to a terminal of the DC power supply VDD 125a integrally.

Incidentally, in the above description, the bending portion from the third conductor portion 115c to the fifth conductor portion 115e is arranged on the first conductor portion 115a and the sixth conductor portion 115f which have a linear shape, but it is not limited to this. For example, the first conductor portion 115a and the sixth conductor portion 115f do not have to be substantially in parallel to one side of the virtual square. That is, various changes may be added as long as a bending portion is formed between the first conductor portion 115a and the sixth conductor portion 115f.

Specifically, it may be arranged that the first conductor portion 115a and the sixth conductor portion 115f are not in parallel to each other and not positioned along one side of the virtual square, or that they are in parallel to each other but not positioned along one side of the virtual square.

Further, in the above description, the second conductor portion 115b and the fifth conductor portion 115e bend substantially orthogonally inward of the virtual square from the first conductor portion 115a and the sixth conductor portion 115f respectively, but are not limited to this. That is, the second conductor portion 115b and the fifth conductor portion 115e can be bent at a predetermined angle as long as it is larger than 0° from the first conductor portion 115a and the sixth conductor portion 115f respectively.

Similarly to the first inductive conductor 115, in the first inductive conductors 116 to 118 the first conductor portion 116a and the sixth conductor portion 116f . . . the first conductor portion 118a and the sixth conductor portion 118f form first linear portions and second linear portions respectively. The first conductor portions 116a, 117a, 118a have one ends connected to the positive output terminals of the sub-gain stages 112a, 113a, 114a respectively. The sixth conductor portions 116f, 117f, 118f have one ends connected to the positive output terminals of the sub-gain stages 113b, 114b, 111b respectively. The first conductor portion 116a and the sixth conductor portion 116f . . . the first conductor portion 118a and the sixth conductor portion 118f are arranged along one side of the virtual square on the circuit board 124.

Further, in the first inductive conductors 116 to 118, the second conductor portion 116b and the fifth conductor portion 116e . . . the second conductor portion 118b and the fifth conductor portion 118e form third linear portions and fourth linear portions respectively. The third conductor portion 116c and the fourth conductor portion 116d . . . the third conductor portion 118c and the fourth conductor portion 118d form first linear portions.

That is, the second conductor portion 116b to the fifth conductor portion 116e . . . the second conductor portion 118b to the fifth conductor portion 118e are bending portions.

The second conductor portion 116b to the fifth conductor portion 116e . . . the second conductor portion 118b to the fifth conductor portion 118e form recessed portions bending inward of the virtual square.

That is, the second conductor portion 116b and the fifth conductor portion 116e . . . the second conductor portion 118b and the fifth conductor portion 118e bend substantially orthogonally inward of the virtual square from the first conductor portion 116a and the sixth conductor portion 116f . . . the first conductor portion 118a and the sixth conductor portion 118f respectively, and are arranged with a predetermined line length. Further, the third conductor portion 116c and the fourth conductor portion 116d . . . the third conductor portion 118c and the fourth conductor portion 118d connect one ends of the second conductor portion 116b and the fifth conductor portion 116e to each other.

The third conductor portion 116c and the fourth conductor portion 116d . . . the third conductor portion 118c and the fourth conductor portion 118d share one ends with each other, and are connected to terminals of the DC power supply VDD 125b to the DC power supply VDD 125d integrally.

In the amplifier 110 having the above structure, signals in phase with each other are inputted to the sub-gain stages 111a, 112a, 113a, 114a. Further, signals in reverse phase with the signals inputted to the sub-gain stages 111a, 112a, 113a, 114a are inputted to the sub-gain stages 111b, 112b, 113b, 114b.

Accordingly, in-phase currents flow through the first to third conductor portions 115a to 115c . . . 118a to 118c. Further, currents in reverse phase from the currents flown through the first to third conductor portions 115a to 115c . . . 118a to 118c flow through the fourth to sixth conductor portions 115d to 115f . . . 118d to 118f.

Then, electric power is combined by magnetic field coupling between the first inductive conductors 115 to 118 and the second inductive conductor 123.

Next, using FIG. 4 and FIG. 5, a relationship between the line lengths and inductances of the second conductor portions 115b . . . 118b will be described.

The first inductive conductors 115 . . . 118 have substantially the same structures and exhibit common operations. Thus, the first inductive conductor 115 will be described in detail here, and descriptions of the other first inductive conductors 116 to 118 are omitted.

Further, the first to third conductor portions 115a to 115c and the fourth to six conductor portions 115d to 115f of the first inductive conductor 115 have line symmetry with each other with the arrangement position of the DC power supply VDD 125a being the line of symmetry. Thus, the first to third conductor portions 115a to 115c will be described in detail here, and descriptions of the other, fourth to sixth conductor portions 115d to 115f are omitted.

Figure 4:
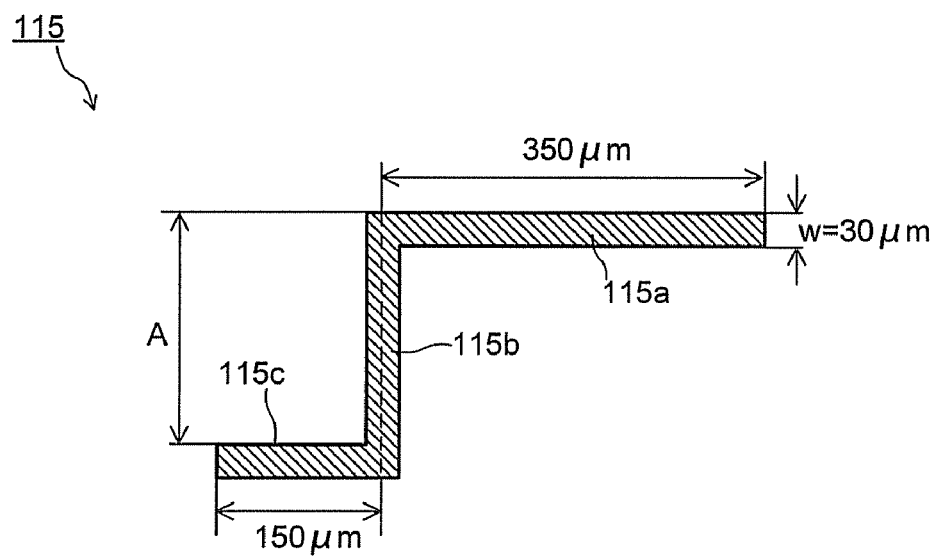
FIG. 4 is a diagram showing, in enlargement, a first conductor portion 115a, a second conductor portion 115b, and a third conductor portion 115c.

As shown in FIG. 4, widths W of the first to third conductor portions 115a to 115c are formed to be 30 [μm] in common. Further, the first conductor portion 115a is formed to have a line length that is 350 [μm] from the center line (dashed line in the diagram) of the second conductor portion 115b. The third conductor portion 115c is formed to have a line length that is 150 [μm] from the center line of the second conductor portion 115b.

Inductances obtained when a line length A of the second conductor portion 115b is 0 [μm] to 250 [μm] when the first, third conductor portions 115a, 115c are formed as described above are shown in FIG. 5.

Figure 5:
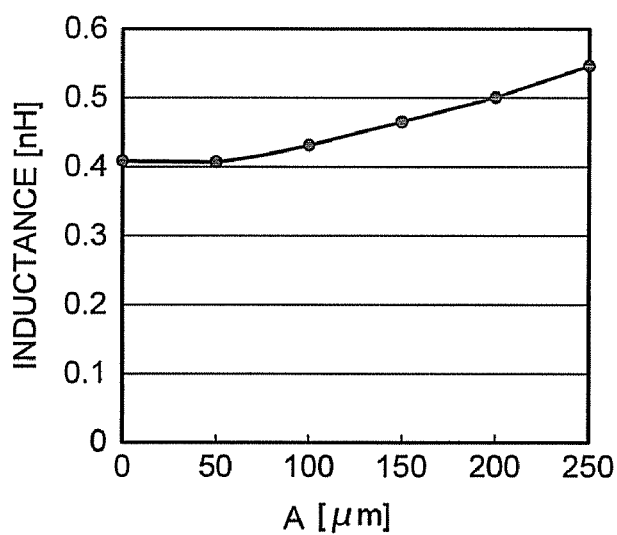
FIG. 5 is a characteristic chart showing a relationship between a line length and inductances of the second conductor portion 115b.

Specifically, FIG. 5 shows a relationship between increments of the line length A of the second conductor portion 115b and inductance components obtained by the first to third conductor portions 115a to 115c.

When the line length of the second conductor portion 115b is changed in the range of 0 [μm] to 250 [μm], the inductance value corresponding to the line length A increases in sequence between 0.4 [nH] and 0.6 [nH]. Particularly, when the line length A is 50 [μm] or longer, increase in inductance value becomes significant.

As described above, the inductance value can be increased easily by extending the line length of the second conductor portion 115b.

Incidentally, when the line length A of the second conductor portion 115b is 0 [μm], the first, third conductor portions 115a, 115c are connected linearly to each other. That is, when the line length A of the second conductor portion 115b is 0 [μm], an amplifier 110 having no bending portion is provided.

As has been described above, with the amplifier 110 according to this embodiment, when the first inductive conductors 115 to 118 have the respective bending portions (the second conductor portions 115b to 118b, the third conductor portions 115c to 118c, the fourth conductor portions 115d to 118d, and the fifth conductor portions 115e to 118e), larger inductance values can be obtained than in the same circuit area as compared to the amplifier 110 having no bending portion.

Further, in the amplifier 110, the line lengths of the entire first inductive conductors 115 to 118 can be extended easily without increasing the size of the amplifier 110, by bending the second conductor portion 115b and the fifth conductor portion 115e . . . the second conductor portion 118b and the fifth conductor portion 118e substantially orthogonally inward of the virtual square of the circuit board 124 from the other ends of the first conductor portion 115a and the sixth conductor portion 115f . . . the first conductor portion 118a and the sixth conductor portion 118f respectively. Consequently, when the inductance value necessary for the circuit operation of the radio 1 is insufficient, the second conductor portions 115b to 118b and the fifth conductor portions 115e to 118e can be extended to obtain a desired inductance.

Here, the case where a spiral inductor is applied to the bending portion is considered. In this case, the self-inductance of the spiral inductor and the stray capacitance between conductors forming the spiral lead to reduction in Q value and self-resonant frequency of the inductor, and this causes reduction in performance of the circuit.

In the amplifier 110 of this embodiment, since the bending portions are formed by the second to fifth conductor portions 115b to 115e . . . the second to fifth conductor portions 118b to 118e which have inductivity and a linear shape, it is possible to suppress reduction in Q value and self-resonant frequency more than by the bending portion to which the spiral inductor is applied.

Second Embodiment

Next, an amplifier 210 according to a second embodiment of the present invention will be described with reference to FIG. 6.

The amplifier 210 of this embodiment is made by changing the shapes of the first inductive conductors 115 to 118 of the amplifier 110 of the first embodiment. Therefore, in the following description, parts overlapping with those in the amplifier 110 of the first embodiment are denoted by the same reference numerals, and detailed descriptions thereof are omitted.

Figure 6:
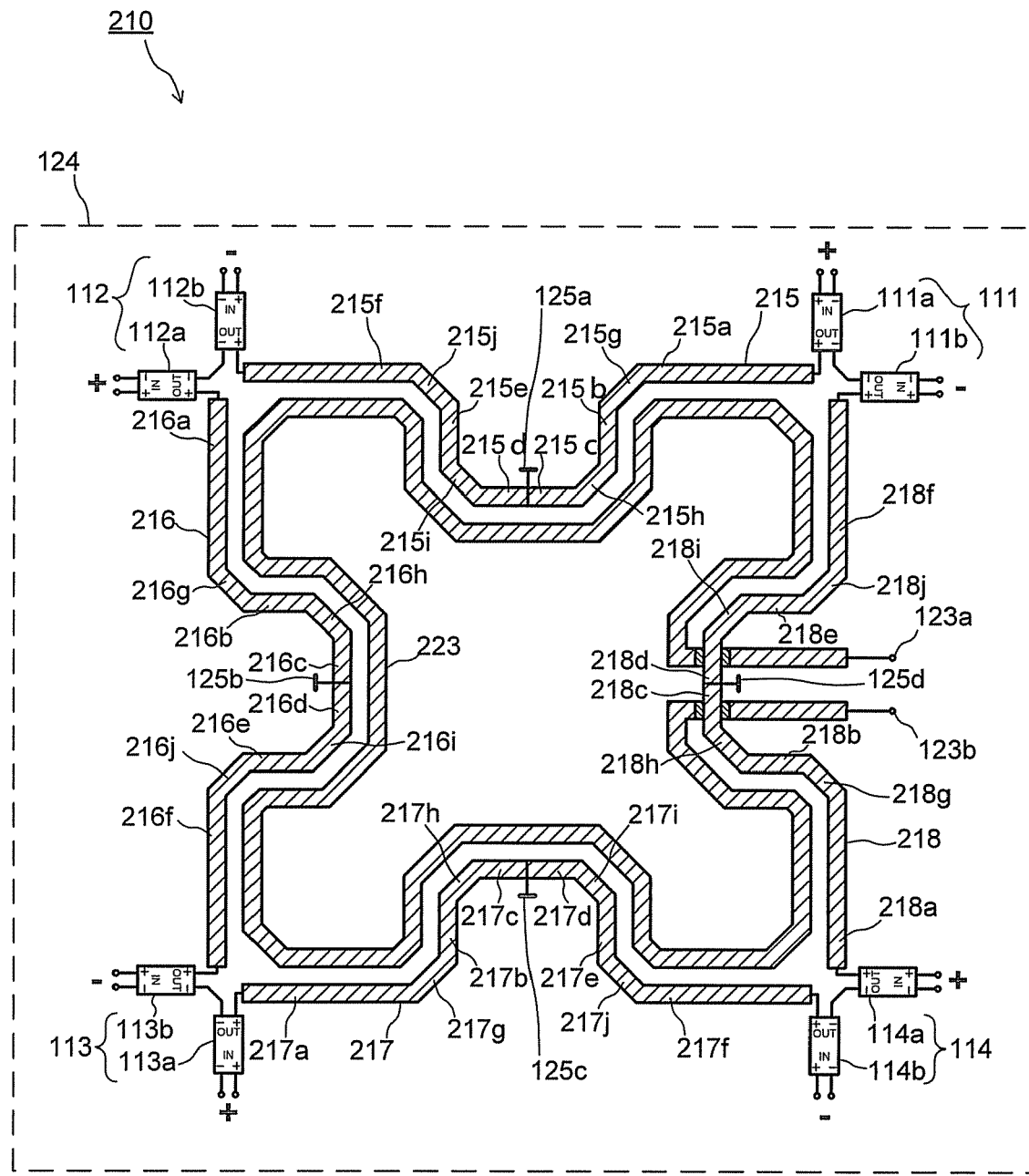
FIG. 6 is a diagram showing an amplifier 210 according to a second embodiment.

As shown in FIG. 6, the amplifier 210 of this embodiment includes gain stages 111 to 114 and DC power supply VDDs 125a to 125d which have structures similar to those of the first embodiment, and exhibit common operations.

Further, the amplifier 210 includes first inductive conductors 215 to 218 and the second inductive conductor 223.

The first inductive conductor 215 is formed by a first conductor 215a to a tenth conductor portion 215j connected to each other, which each have a linear shape.

Similarly, the first inductive conductor 216 is formed by a first conductor portion 216a to a tenth conductor portion 216j connected to each other. The first inductive conductor 217 is formed by a first conductor portion 217a to a tenth conductor portion 217j connected to each other. The first inductive conductor 218 is formed by a first conductor portion 218a to a tenth conductor portion 218j connected to each other.

In the first inductive conductor 215, the first conductor portion 215a to the sixth conductor portion 215f are formed in substantially the same shapes respectively as the first conductor portions 115a to the sixth conductor portions 115f, which are included in the amplifier 110 of the first embodiment.

The seventh conductor portion 215g forms a sixth linear portion. The tenth conductor portion 215j forms a seventh linear portion. The eighth conductor portion 215h forms an eighth linear portion. The ninth conductor portion 215i forms a ninth linear portion. The seventh conductor portion 215g to the tenth conductor portion 215j form a recessed portion bending inward of a virtual square together with the second conductor portions 115b to the fifth conductor portion 115e.

The seventh conductor portion 215g has one end connected to the other end of the first conductor portion 215a, and the other end connected to one end of the second conductor portion 215b. A tenth conductor portion 215j has one end connected to the other end of the sixth conductor 215f, and the other end connected to one end of the fifth conductor portion 215e.

The seventh conductor portion 215g and the tenth conductor portion 215j are arranged with a predetermined angle inward of the virtual square of the circuit board 124 from the other ends of the first conductor portion 215a and the sixth conductor portion 215f, respectively. In this embodiment, by way of example, the seventh conductor portion 215g and the tenth conductor portion 215j are arranged with an angle of approximately 45° from one ends of the first conductor portion 215a and the sixth conductor portion 215f.

The eighth conductor portion 215h has one end connected to the one end of the second conductor portion 215b, and the other end connected to one end of the third conductor portion 215c. The ninth conductor portion 215i has one end connected to one end of the fifth conductor portion 215e, and the other end connected to one end of the third conductor portion 215d.

The eighth conductor portion 215h and the ninth conductor portion 215i are arranged with a predetermined angle inward of the virtual square of the circuit board 124 from the other ends of the second conductor portion 215b and the fifth conductor portion 215e, respectively. In this embodiment, by way of example, the eighth conductor portion 215h and the ninth conductor portion 215i are arranged with an angle of approximately 45° from the other ends of the second conductor portion 215b and the fifth conductor portion 215e, respectively.

Similarly to the first inductive conductor 215, in the second to the fourth inductive conductors 216 to 218, the seventh conductor portion 216g and the tenth conductor portion 216j . . . the seventh conductor portion 218g and the tenth conductor portion 218j form sixth linear portions and seventh linear portions, respectively. The eighth conductor portion 216h and the ninth conductor portion 216i . . . the eighth conductor portion 218h and the ninth conductor portion 218i form eighth linear portions and ninth linear portions, respectively.

That is, the seventh conductor portion 216g to the tenth conductor portion 216j . . . the seventh conductor portion 218g to the tenth conductor portion 218j respectively form recessed portions bending inward of the virtual square together with the second conductor portion 216b to the fifth conductor portion 216e . . . the second conductor portion 218b to the fifth conductor portion 218e.

The shape of the second inductive conductor 223 is substantially the same as that of the first inductive conductors 115 to 118 correspondingly.

In the amplifier 210 structured as above, the seventh conductor portions 215g to 218g, the eighth conductor portions 215h to 218h, the ninth conductor portions 215i to 218i, and the tenth conductor portions 215j to 218j, which are arranged with a predetermined angle, make angles between the conductor portions less sharp.

Consequently, as compared with the case where the conductor portions are bent substantially orthogonally as in the first embodiment, the loss due to reflection of high frequency current occurring at each bending portion can be reduced.

Incidentally, the shapes of the seventh conductor portions 215g to 218g, the eighth conductor portions 215h to 218h, the ninth conductor portions 215i to 218i, and the tenth conductor portions 215j to 218j are not limited to linear shapes, and may be arc shapes. With arc shapes, the connection of each conductor portion becomes more smooth, and the loss due to reflection of high frequency current occurring at each connecting portion can be reduced.

Third Embodiment

Next, an amplifier 310 according to a third embodiment of the present invention will be described with reference to FIGS. 7 and 8. In FIG. 8, a second inductive conductor 323 included in the amplifier 310 is omitted for clarity of description.

The amplifier 310 of this embodiment is made by changing the shapes of the first inductive conductors 116 to 118 of the amplifier 110 of the first embodiment. Therefore, in the following description, parts overlapping with those in the amplifier 110 of the first embodiment are denoted by the same reference numerals, and detailed descriptions thereof are omitted.

Figure 7:
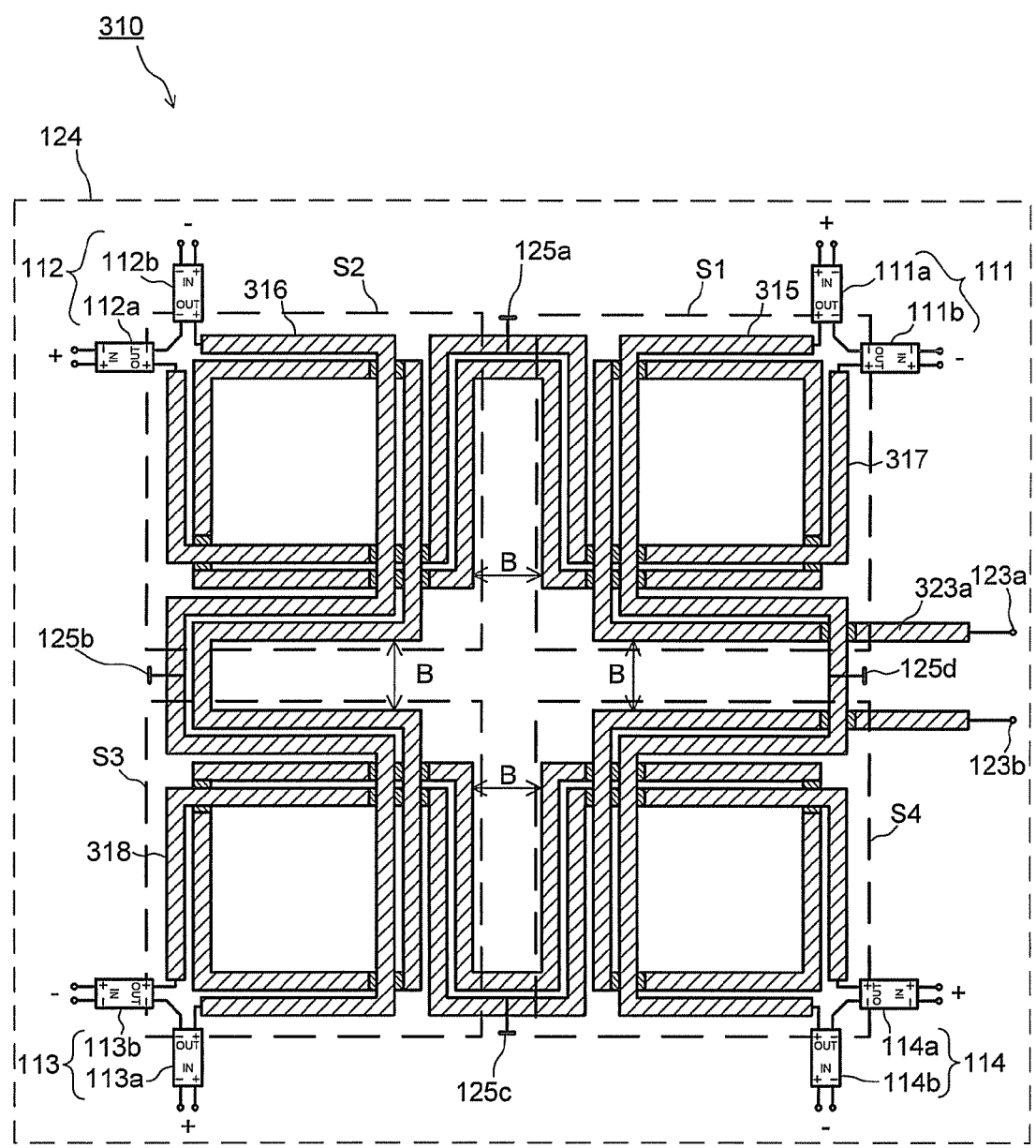
FIG. 7 is a diagram showing an amplifier 310 according to a third embodiment.
Figure 8:
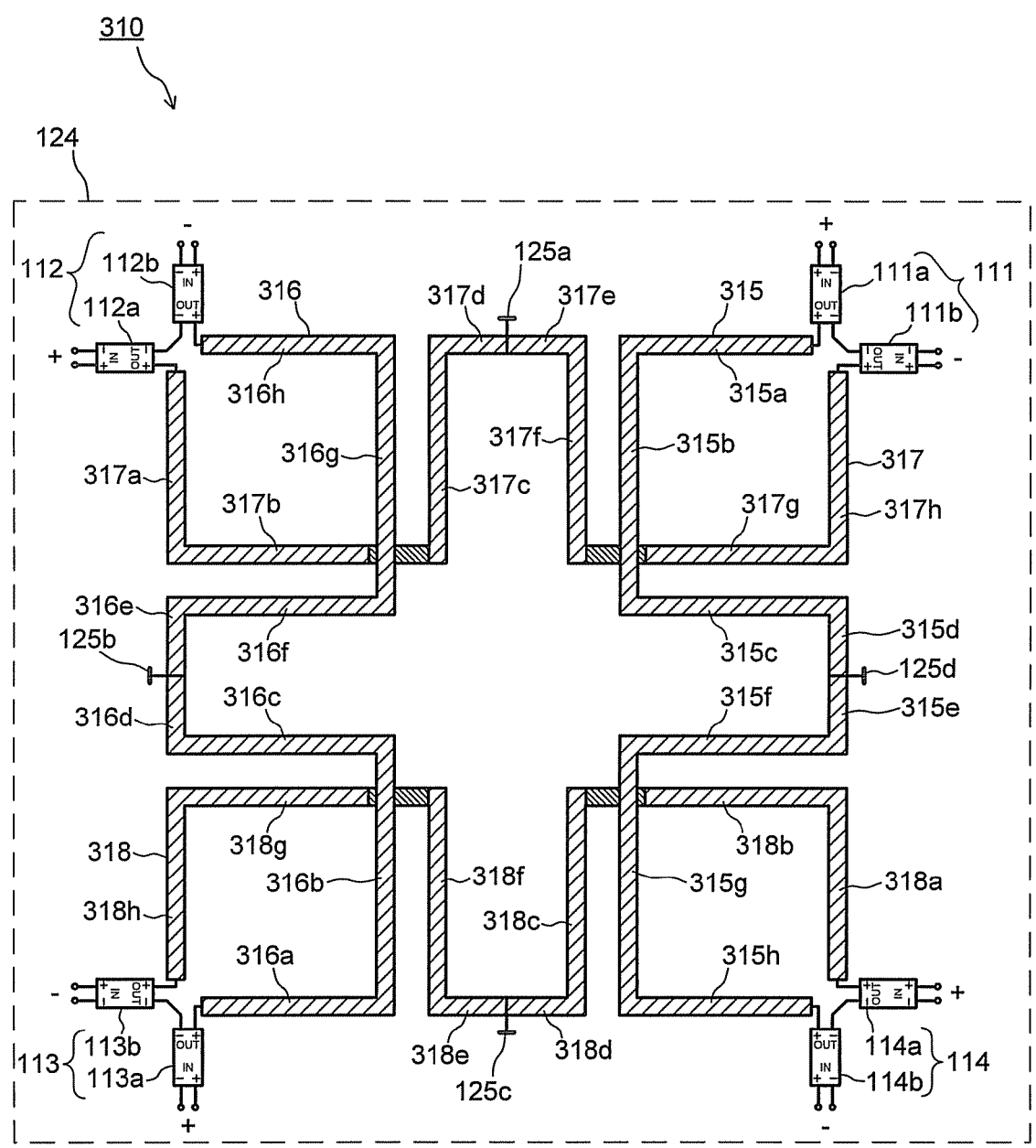
FIG. 8 is a schematic diagram showing first inductive conductors 315 to 318 included in the amplifier 310.

As shown in FIG. 7, the amplifier 310 of this embodiment includes gain stages 111 to 114 and DC power supply VDDs 125a to 125d which have structures similar to those of the first embodiment, and exhibit common operations.

Further, the amplifier 310 includes first inductive conductors 315 to 318 and the second inductive conductor 323.

The arrangement of the gain stages 111 to 114 and the DC power supply VDDs 125a to 125d is substantially the same as in the amplifier 110 of the first embodiment.

Positive output terminals of the sub-gain stage 111a and the sub-gain stage 114b are connected to each other by a first inductive conductor 315. Similarly, the sub-gain stage 112a and the sub-gain stage 111b . . . the sub-gain stage 114a and the sub-gain stage 113b are connected to each other by first inductive conductors 316 to 318, respectively.

The shape of the second inductive conductor 323 is substantially the same as that of the first inductive conductors 315 to 318 correspondingly.

As shown in FIG. 8, the first inductive conductor 315 is formed by a first conductor portion 315a to an eighth conductor portion 315h connected to each other, which each have a linear shape.

Similarly, the first inductive conductor 316 is formed by a first conductor portion 316a to an eighth conductor portion 316h connected to each other. The first inductive conductor 317 is formed by a first conductor portion 317a to an eighth conductor portion 317h connected to each other. The first inductive conductor 318 is formed by a first conductor portion 318a to an eighth conductor portion 318h connected to each other.

In the first inductive conductor 315, the first conductor portion 315a forms a tenth linear portion. The eighth conductor portion 315h forms an eleventh linear portion. The first conductor portion 315a and the eighth conductor portion 315h are arranged along one side of a virtual square on the circuit board 124.

The first conductor portion 315a has one end connected to the positive output terminal of the sub-gain stage 111a. The eighth conductor portion 315h has one end connected to the positive output terminal of the sub-gain stage 114b.

The second conductor portion 315b forms a twelfth linear portion. The seventh conductor portion 315g forms a thirteenth linear portion. The third conductor portion 315c forms a fourteenth linear portion. The sixth conductor portion 315f forms a fifteenth linear portion. The fourth conductor portion 315d and the fifth conductor portion 315e form a sixteenth linear portion.

That is, the second conductor portion 315b to the seventh conductor portion 315g are a bending portion. The second conductor portion 315b to the seventh conductor portion 315g form a recessed portion bending outward of the virtual square. That is, the second conductor portion 315b and the seventh conductor portion 315g are arranged to bend substantially orthogonally inward of the virtual square from the first conductor portion 315a and the eighth conductor portion 315h, respectively.

The third conductor portion 315c and the sixth conductor portion 315f bend substantially orthogonally outward of the virtual square from the second conductor portion 315b and the seventh conductor portion 315g respectively, and are arranged with a predetermined line length.

Further, the fourth conductor portion 315d and the fifth conductor portion 315e connect one ends of the third conductor portion 315c and the sixth conductor portion 315f to each other.

The fourth conductor portion 315d and the fifth conductor portion 315e share one ends with each other, and are connected to a terminal of the DC power supply VDD 125d integrally.

Incidentally, similarly to the first conductor portion 115a and the sixth conductor portion 115f of the first embodiment, the first conductor portion 315a and the eighth conductor portion 315h do not have to be substantially in parallel to one end of the virtual square. Similarly, the second conductor portion 315b and the seventh conductor portion 315g do not have to be bent substantially orthogonally inward of the virtual square from the first conductor portion 315a and the eighth conductor portion 315h respectively, and may be bent at a predetermined angle as long as it is larger than 0° from the first conductor portion 315a and the eighth conductor portion 315h. Further, the third conductor portion 315c and the sixth conductor portion 315f do not have to be bent substantially orthogonally outward of the virtual square, and may be bent at a predetermined angle.

Similarly to the first inductive conductor 315, in the first inductive conductors 316 to 318, the first conductor portion 316a and the eighth conductor portion 316h . . . the first conductor portion 318a and the eighth conductor portion 318h form tenth linear portions and eleventh linear portions, respectively. The first conductor portion 316a and the eighth conductor portion 316h . . . the eleventh conductor portion 318a and the eighth conductor portion 318h are arranged along one side of a virtual square on the circuit board 124.

The first conductor portions 316a, 317a, 318a have one ends connected to positive output terminals of the sub-gain stages 113a, 112a, 114a, respectively. The eighth conductor portions 316h, 317h, 318h have one ends connected to positive output terminals of the sub-gain stages 112b, 111b, 113b, respectively.

Further, in the first inductive conductors 316 to 318, a second conductor portion 316b and a seventh conductor portion 316g . . . a second conductor portion 318b and a seventh conductor portion 318g form twelfth linear portions and thirteenth linear portions, respectively. A fourth conductor portion 316d and a fifth conductor portion 316e . . . a fourth conductor portion 318d and a fifth conductor portion 318e form sixteenth linear portions.

That is, the second conductor portion 316b to the seventh conductor portion 316g . . . the second conductor portion 318b to the seventh conductor portion 318g are bending portions. The second conductor portion 316b to the seventh conductor portion 316g . . . the second conductor portion 318b to the seventh conductor portion 318g form recessed portions bending outward of the virtual square.

A fourth conductor portion 316d and a fifth conductor portion 316e . . . a fourth conductor portion 118d and a fifth conductor portion 318e share one ends with each other, and are connected to terminals of the DC power supply VDDs 125b to 125d, respectively.

With the amplifier 310 having the above structure, the first inductive conductors 315 to 318 and the second inductive conductor 323 can be extended efficiently. Therefore, higher inductance values can be achieved.

Further, in the amplifier 310, the second conductor portion 315b and the seventh conductor portion 317g, the second conductor portion 316b and the seventh conductor portion 318g, the second conductor portion 318b and the sixth conductor portion 315g, and the second conductor portion 318b and the second conductor portion 317b cross each other (orthogonally). Consequently, it is possible to suppress magnetic field coupling of the first inductive conductors 315 to 318 with each other.

In the amplifier 310, a plurality of annular portions C1 to C4 are formed (see FIG. 7) together with the second inductive conductor 323 formed in a shape corresponding to the first inductive conductors 315 to 318.

The plurality of annular portions C1 to C4 are formed with predetermined distances from each other (for example, distances B in the diagram). By this arrangement, it is possible to prevent, for example, cancelling of magnetic fields of the second inductive conductor 323 in the vicinity of the output terminals 123a, 123b with each other. Consequently, reduction ineffective inductance values caused by cancellation of magnetic fields with each other can be avoided.

Incidentally, at respective intersections of the conductor portions, insulating process with resin or the like is performed so that no short-circuit occurs between conductors.

Fourth Embodiment

Next, an amplifier 410 according to a fourth embodiment of the present invention will be described with reference to FIG. 9. The amplifier 410 of this embodiment is structured such that the arrangement of the DC power supply VDDs 125a to 125d of the amplifier 110 and the arrangement of the gain stages 111 to 114 of the first embodiment are interchanged with each other.

Therefore, in the following description, parts overlapping with those in the amplifier 110 of the first embodiment are denoted by the same reference numerals, and detailed descriptions thereof are omitted.

Figure 9:
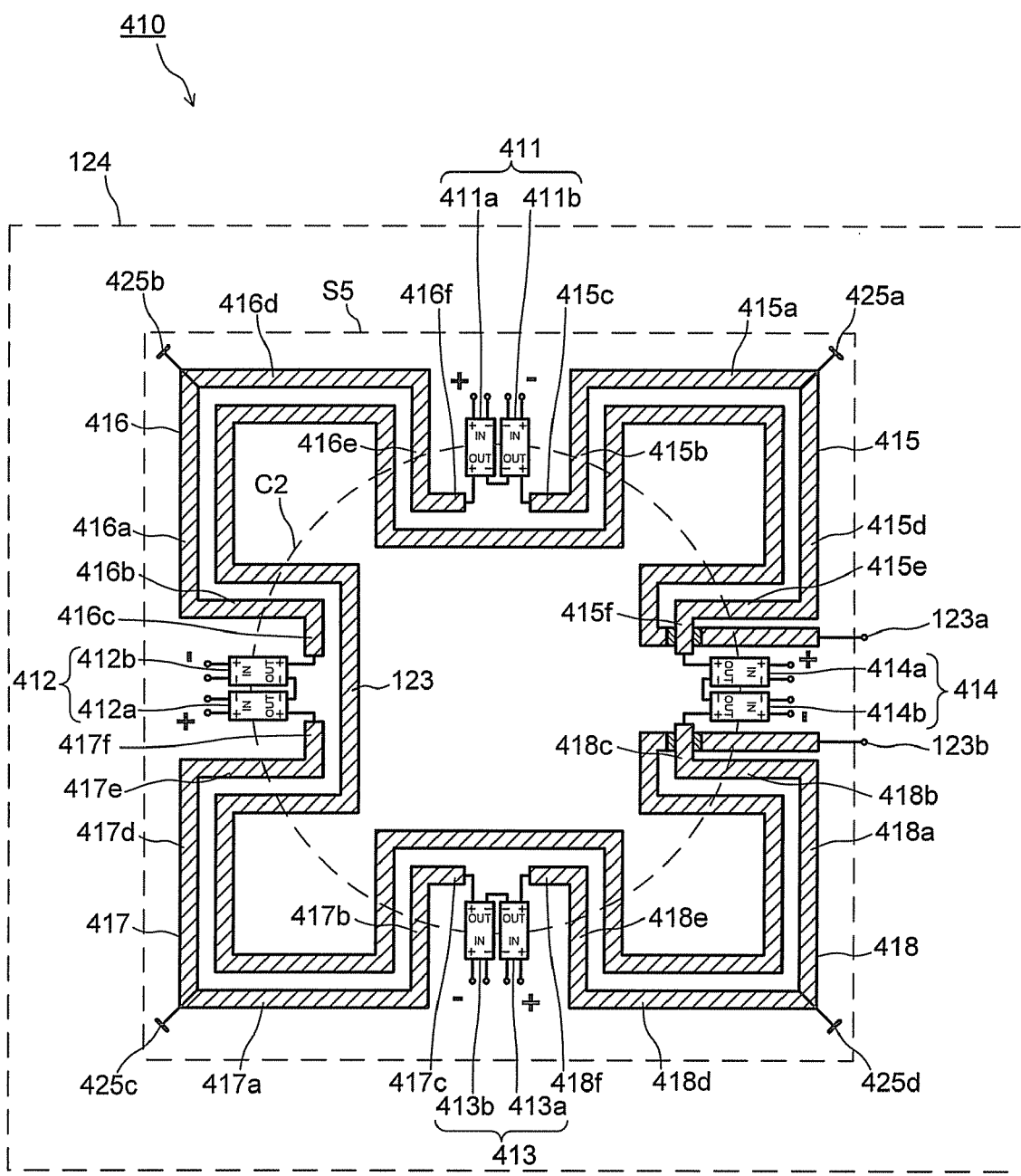
FIG. 9 is a diagram showing an amplifier 410 according to a fourth embodiment.

As shown in FIG. 9, the amplifier 410 of this embodiment includes gain stages 411 to 414 and DC power supply VDDs 425a to 425d which have structures similar to the gain stages 111 to 114 and the DC power supply VDDs 125a to 125d of the first embodiment, and exhibit common operations. Further, the amplifier 410 includes first inductive conductors 415 to 418.

The DC power supply VDDs 425a to 425d are arranged in a distributed manner respectively in the vicinities of vertexes of a virtual square S5 on the circuit board 124.

The gain stages 411 to 414 are arranged in a distributed manner on the circumference of a virtual circle C2 on the circuit board 124 having a smaller diameter than the virtual circle C1 shown in FIG. 2. Further, the gain stages 411 to 414 are arranged in the vicinities of center portions of respective sides of the square S5. The gain stages 411 to 414 have pairs of sub-gain stages 411a and 411b to 414a and 414b, respectively.

The first inductive conductors 415 to 418 are arranged so as to form a substantially square shape having vertexes in the vicinities of the DC power supply VDDs 425a to 425d.

The first inductive conductor 415 is formed by a first conductor portion 415a to a sixth conductor portion 415f connected to each other, which each have a linear shape.

Similarly, the first inductive conductor 416 is formed by a first conductor portion 416a to a sixth conductor portion 416f connected to each other. The first inductive conductor 417 is formed by a first conductor portion 417a to a sixth conductor portion 417f connected to each other. The first inductive conductor 418 is formed by a first conductor portion 418a to a sixth conductor portion 418f connected to each other.

In the first inductive conductor 415, the first conductor portion 415a to the sixth conductor portion 415f form seventeenth to twenty-second linear portions respectively. That is, the first conductor portion 415a to the sixth conductor portion 415f are a bending portion.

The first conductor portion 415a has one end connected to the DC power supply VDD 425a. The first conductor portion 415a is arranged along one side of the virtual square S5 coupling the DC power supply VDD 425a and the DC power supply VDD 425d adjacent to this DC power supply VDD 425a.

The second conductor portion 415b is arranged at a predetermined angle inward of the virtual square S5 of the circuit board 124 from the other end of the first conductor portion 415a. Here, as an example, the second conductor portion 415b is arranged substantially orthogonally from the first conductor portion 415a.

The third conductor portion 415c connects the other end of the second conductor portion 415b and a positive output terminal of the sub-gain stage 411b.

The fourth conductor portion 415d has one end connected to the DC power supply VDD 425a. The fourth conductor portion 415d is arranged along one side of the virtual square S5 coupling the DC power supply VDD 425a and the DC power supply VDD 425b adjacent to this DC power supply VDD 425a. That is, the fourth conductor portion 415d is orthogonal to the first conductor portion 415a.

The fifth conductor portion 415e is arranged at a predetermined angle inward of the virtual square of the circuit board 124 from the other end of the fourth conductor portion 415d. Here, as an example, the second conductor portion 415b is arranged substantially orthogonally from the first conductor portion 415a.

The sixth conductor portion 415f connects the other end of the fifth conductor portion 415e and a positive output terminal of the sub-gain stage 414a.

The first inductive conductor 415 has been described above. Incidentally, similarly to the first conductor portion 115a and the sixth conductor portion 115f of the first embodiment, the first conductor portion 415a and the fourth conductor portion 415d do not have to be substantially in parallel to one side of the virtual square S5.

In the first inductive conductors 416 to 418, similarly to the first inductive conductor 415, the first conductor portion 416a to the sixth conductor portion 416f . . . the first conductor portion 418a to the sixth conductor portion 418f form seventeenth to twenty-second linear portions. That is, the first conductor portion 416a to the sixth conductor portion 416f . . . the first conductor portion 418a to the sixth conductor portion 418f are bending portions.

The first conductor portions 416a to 418a have one ends connected to the DC power supply VDDs 425b to 425d respectively, and are arranged along one sides of the virtual square S5 which each couple adjacent DC power supply VDDs.

The second conductor portions 416b to 418b are arranged inward of the virtual square S5 of the circuit board 124 from the other ends of the first conductor portions 416a to 418a, respectively.

The third conductor portions 416c to 418c connect the other ends of the second conductor portions 416b to 418b and positive output terminals of the sub-gain stages 412b to 414b, respectively.

The fourth conductor portions 416d to 418d have, similarly to the first conductor portion 415d, one ends connected to the DC power supply VDDs 425b to 425d respectively, and are arranged along one sides of the virtual square S5 which each couple adjacent DC power supply VDDs.

The fifth conductor portions 416e to 418e are arranged inward of the virtual square S5 of the circuit board 124 from the other ends of the fourth conductor portions 416d to 418d, respectively.

The sixth conductor portions 415f to 418f connect the other ends of the fifth conductor portions 416e to 418e and positive output terminals of the sub-gain stages 412a to 414a, respectively.

In the amplifier 410 having the structure as above, the amplifier 410 can be further reduced in area by arranging the gain stages 410a to 440a on the circumference of the virtual circle C2.

Fifth Embodiment

Next, an amplifier 510 according to a fifth embodiment of the present invention will be described with reference to FIG. 10. The amplifier 510 of this embodiment is structured such that choke inductors 500a to 500d are arranged in the amplifier 110 of the first embodiment.

Therefore, in the following description, parts overlapping with those in the amplifier 110 of the first embodiment are denoted by the same reference numerals, and detailed descriptions thereof are omitted.

Figure 10:
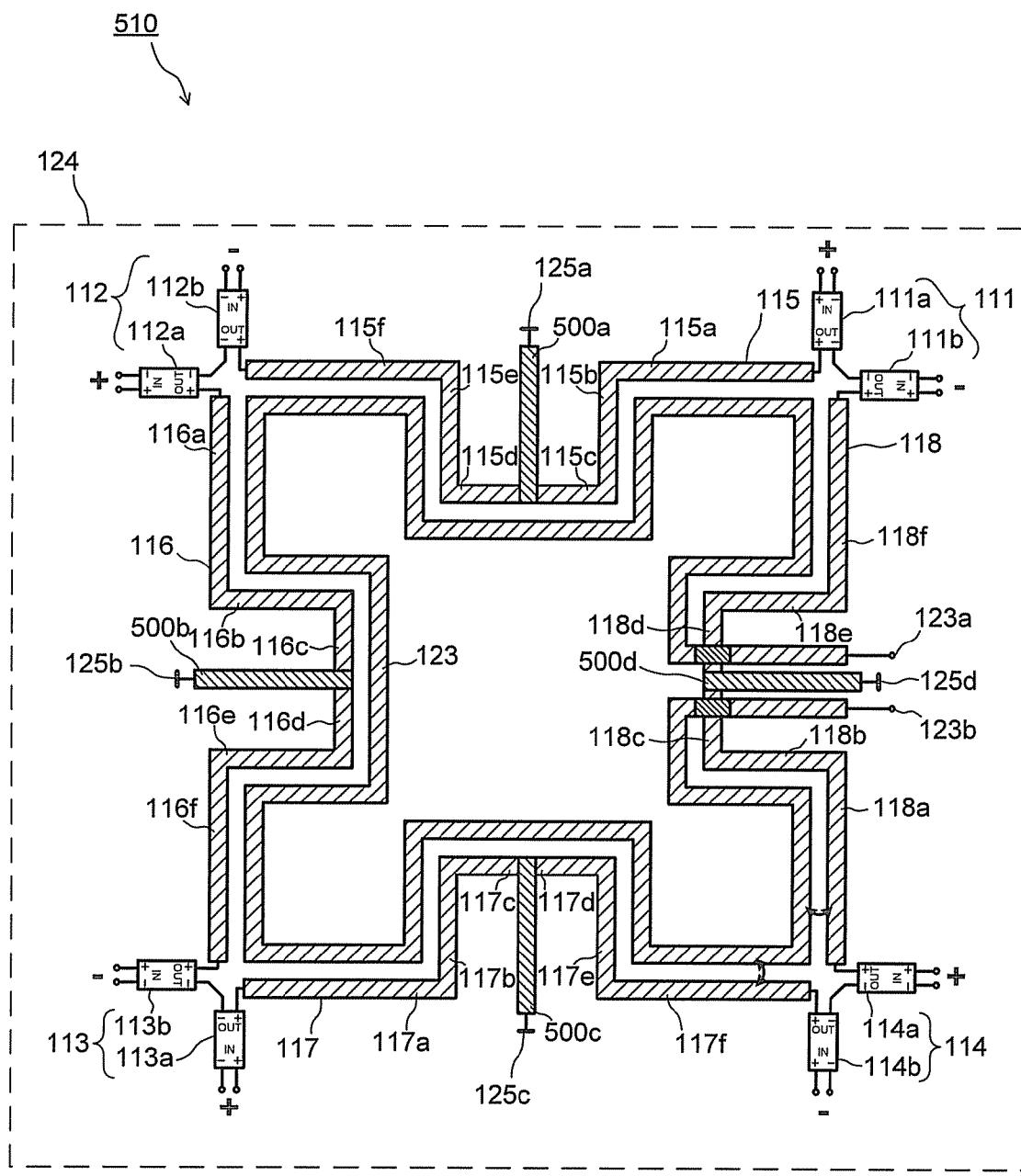
FIG. 10 is a diagram showing an amplifier 510 according to a fifth embodiment.

As shown in FIG. 10, the amplifier 510 of this embodiment has gain stages 111 to 114, first inductive conductors 115 to 118, second inductive conductors 115 to 118, and DC power supply VDDs 125a to 125d, which have the same structures and operations as in the first embodiment. Arrangements of the gain stages 111 to 114, the first inductive conductors 115 to 118, the second inductive conductors 115 to 118, and so on are substantially the same as in the amplifier 110 of the first embodiment.

The choke inductors 500a to 500d have a function to stabilize the power supply current supplied to the amplifier 510. Therefore, by arranging the choke inductors 500a to 500d in the circuit board 124, an external power supply filter can be reduced in size or eliminated.

The choke inductor 500a has one end connected to one ends of the third conductor portion 115c and the fourth conductor portion 115d. The choke inductor 500a has the other end connected to the DC power supply VDD 125a. That is, the choke inductor 500a is arranged between the third conductor portion 115c and the fourth conductor portion 115d and the DC power supply VDD 125a.

The choke inductor 500a is arranged in a substantially middle portion of a space sandwiched by the second conductor portions 115b, 115e. Incidentally, the choke inductor 500a can be formed not only in a linear shape but in a bending shape or a ring shape. Also with such a shape, it is desirable that the choke inductor 500a is arranged to fit in the space sandwiched by the second conductor portions 115b, 115e.

The choke inductors 500b to 500d have, similarly to the choke inductor 500a, one ends connected to one ends of the third conductor portion 116c and the fourth conductor portion 116d . . . the third conductor portion 118c and the fourth conductor portion 118d, respectively.

The choke inductors 500b to 500d have the other ends connected to the DC power supply VDD 125b to VDD 125d, respectively.

The choke inductors 500b to 500d are arranged respectively in middle portions of spaces sandwiched by the second conductor portions 116b and 116e . . . the second conductor portions 118b and 118e.

Next, a relationship between line lengths and inductances of the second conductor portions 115b to 118b and the choke inductors 500a to 500d will be described using FIGS. 11, 12.

The first inductive conductors 115 to 118 have substantially the same structures and exhibit common operations. Thus, the first inductive conductor 115 will be described in detail here, and descriptions of the other first inductive conductors 116 to 118 are omitted.

Further, the first to third conductor portions 115a to 115c and the fourth to six conductor portions 115d to 115f of the first inductive conductor 115 have line symmetry with each other with the arrangement position of the DC power supply VDD 125a being the line of symmetry. Thus, the first to third conductor portions 115a to 115c will be described in detail here, and descriptions of the other fourth to sixth conductor portions 115d to 115f are omitted.

Likewise, the choke inductor 500a will be described here.

Figure 11:
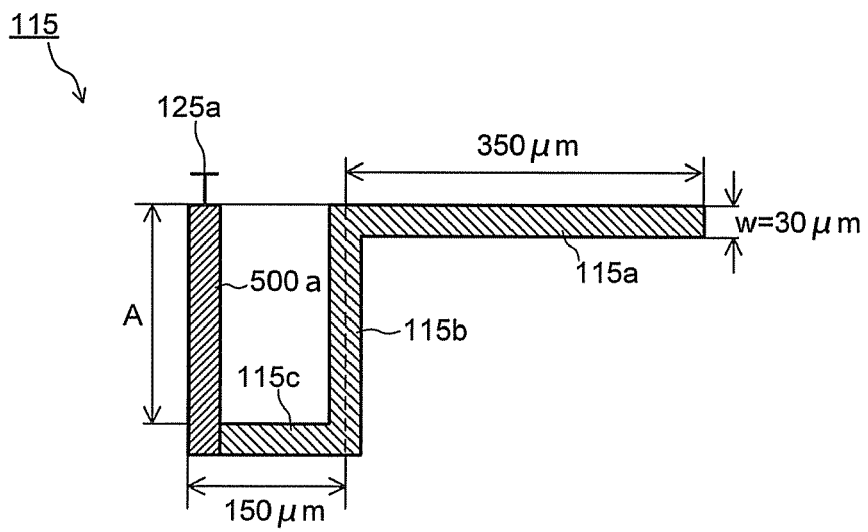
FIG. 11 is a diagram showing, in enlargement, a first conductor portion 115a, a second conductor portion 115b, a third conductor portion 115c, and a choke inductor 500a included in the amplifier 510.

As shown in FIG. 11, widths W of the first to third conductor portions 115a to 115c and the choke inductor 500a are formed to be 30 [μm] in common. Further, the first conductor portion 115a is formed to have a line length that is 350 [μm] from the center line (dashed line in the diagram) of the second conductor portion 115b. The third conductor portion 115c is formed to have a line length that is 150 [μm] from the center line of the second conductor portion 115b.

Inductances obtained when a line length A of the second conductor portions 115b to 118b and the choke inductor 500a is 0 [μm] to 250 [μm] when the first, third conductor portions 115a, 115c are formed as described above are shown in FIG. 12.

Figure 12:
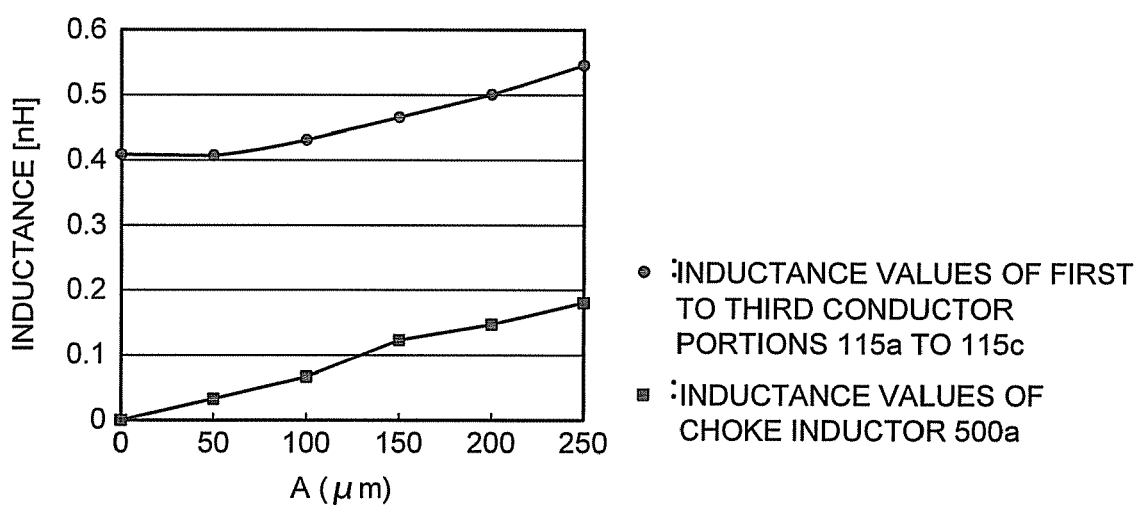
FIG. 12 is a characteristic chart showing a relationship between line lengths and inductances of the second conductor portion 115b and the choke inductor 500a included in the amplifier 510.

Specifically, FIG. 12 shows a relationship between increments of the line length A of the second conductor portion 115b and the choke inductor 500a and inductance components obtained by the first to third conductor portions 115a to 115c.

When the line lengths of the second conductor portions 115b to 118b are changed in the range of 50 [μm] to 250 [μm], the inductance value corresponding to the line length A increases in sequence between 0.4 [nH] and 0.6 [nH]. Particularly, when the line length A is 50 [μm] or longer, increase in inductance value becomes significant.

When the line length of the choke inductor 500a is changed in the range of 0 [μm] to 250 [μm], the inductance value increases in sequence between 0 [nH] and 0.2 [nH] corresponding to the line length A.

As described above, the respective inductance values can be increased easily by extending the line length of the second conductor portion 115b and the choke inductor 500a.

Incidentally, the line length A=0 [μm] of the choke inductor 500a indicates a state of having no choke inductor 500a.

In the amplifier 510 having the structure as above, the amplifier 510 can be further reduced in area by arranging the choke inductors 500a to 500d respectively in the middle portions of the spaces, which are sandwiched respectively by the second conductor portions 115b, 115e . . . the second conductor portions 118b, 118e.

Conventionally, the choke inductors 500a to 500d are often arranged outside the amplifier 510 for convenience of arrangement areas. In such cases, it is possible that the circuit area enlarges corresponding to the arranged areas of the choke inductors 500a to 500d.

In the amplifier 510, by arranging the choke inductors 500a to 500d in the middle portions of the spaces, the choke inductors 500a to 500d can be arranged without enlarging the area of the circuit, and thereby it is possible to prevent increase in circuit area.

Further, by extending the line lengths of the second conductor portions 115b to 118b, the line lengths of the choke inductors 500a to 500d can be extended easily. Therefore, inductance values of the choke inductors 500a to 500d can be increased easily.

Other Embodiments

It should be noted that the present invention is not limited to the above-described embodiments as they are, and in an implementation stage, the invention can be embodied with the components modified in the range not departing from the spirit of the invention. Further, various inventions can be formed by appropriately combining a plurality of the components disclosed in the above embodiments. For example, several components out of all the components shown in the embodiments may be eliminated. Furthermore, components across different embodiments may be combined appropriately.

For example, in the above embodiments, there are described examples in which the first inductive conductors 115 to 118 and the second inductive conductor 123 are arranged on the same plane on the circuit board 124, but there may be adopted a structure in which the first inductive conductors 115 to 118 and the conductors and the second inductive conductor 123 overlap each other vertically. In this structure, the first inductive conductors 115 to 118 and the second inductive conductor 123 are overlapped vertically with a predetermined gap therebetween so that they do not short circuit with each other.

Further, in the above embodiments, digital signals are converted into analog signals by the transmission signal generating unit 101, but the transmission signal generating unit 101 does not have to perform this conversion. That is, a radio 1 according to another embodiment of the present invention includes an arrangement that handles digital signals only. Further, a radio 1 according to another embodiment of the present invention includes an arrangement that handles analog signals only.

What is claimed is:
1. An amplifier, comprising:
a substrate;
first to fourth amplifying units arranged on the substrate and each having first and second terminals, and each amplifying first and second signals to generate first and second amplified signals;
a first inductive line arranged on the substrate, connecting the first terminal of the first amplifying unit and the first terminal of the second amplifying unit, and having a linear portion and a bending portion;
a second inductive line arranged on the substrate, connecting the second terminal of the second amplifying unit and the first terminal of the third amplifying unit, and having a linear portion and a bending portion;
a third inductive line arranged on the substrate, connecting the second terminal of the third amplifying unit and the first terminal of the fourth amplifying unit, and having a linear portion and a bending portion;
a fourth inductive line arranged on the substrate, connecting the second terminal of the fourth amplifying unit and the second terminal of the first amplifying unit, and having a linear portion and a bending portion; and
a fifth inductive line which establishes magnetic field coupling with the first to fourth inductive lines, and has third and fourth terminals, combines the plurality of the first amplified signals amplified to output the first combined signal from the third terminal, and combines the plurality of the second amplified signals to output the second combined signal from the fourth terminal.

2. The amplifier according to claim 1,
wherein the first to fourth amplifying units each have a pair of amplifying elements comprising respective positive and negative output terminals;
wherein the respective negative output terminals of the pair of amplifying elements are connected to each other; and
wherein the respective positive output terminals of the pair of amplifying elements correspond to the first and second terminals.

3. The amplifier according to claim 1, further comprising,
first to fourth power supply terminals arranged in substantially middle portions of the bending portions of the first to fourth inductive lines respectively, and supplying power supply voltages of the first to fourth amplifiers.

4. The amplifier according to claim 1,
wherein the first to fourth inductive lines are arranged in a substantially rectangular shape with the first to fourth amplifying units being vertexes.

5. The amplifier according to claim 1,
wherein the linear portion of the first inductive line has:
a first linear portion comprising one end connected to the first terminal of the first amplifying unit; and
a second linear portion comprising one end connected to the first terminal of the second amplifying unit; and
wherein the bending portion of the first inductive line has:
a third linear portion comprising one end connected to the other end of the first linear portion and facing a direction different from a direction which the first linear portion faces;
a fourth linear portion comprising one end connected to the other end of the second linear portion and facing a direction in which the second linear portion is disposed; and
a fifth linear portion connecting the other ends of the third and fourth linear portions.

6. The amplifier according to claim 5,
wherein the first inductive line further has:
- a sixth linear portion connecting the other end of the first linear portion and the one end of the third linear portion;
- a seventh linear portion connecting the other end of the second linear portion and the one end of the fourth linear portion;
- an eighth linear portion connecting the other end of the third linear portion and the one end of the fifth linear portion; and
- a ninth linear portion connecting the other end of the fourth linear portion and the other end of the fifth linear portion.

7. The amplifier according to claim 1,
wherein the linear portion of the first inductive line has:
- a tenth linear portion comprising one end connected to the first terminal of the first amplifying unit; and
- an eleventh linear portion comprising one end connected to the first terminal of the second amplifying unit; and wherein the bending portion of the first inductive line has:
- a twelfth linear portion comprising one end connected to the other end of the tenth linear portion and facing a first direction different from a direction which the tenth linear portion faces;
- a thirteenth linear portion comprising one end connected to the other end of the eleventh linear portion and facing a second direction different from a direction which the eleventh linear portion faces;
- a fourteenth linear portion comprising one end connected to the other end of the twelfth linear portion and facing a third direction different from the first direction;
- a fifteenth linear portion comprising one end connected to the other end of the thirteenth linear portion and facing a fourth direction different from the second direction; and
- a sixteenth linear portion connecting the respective other ends of the fourteenth and fifteenth linear portions.

8. The amplifier according to claim 7,
wherein the linear portion of the second inductive line has:
- a twentieth linear portion comprising one end connected to the second terminal of the second amplifying unit; and
- a twenty-first linear portion comprising one end connected to the first terminal of the third amplifying unit;

wherein the bending portion of the second inductive line has:
- a twenty-second linear portion comprising one end connected to the other end of the twentieth linear portion and facing a fifth direction different from a direction which the twentieth linear portion faces;
- a twenty-third linear portion comprising one end connected to the other end of the twenty-first linear portion and facing a sixth direction different from a direction which the twenty-first linear portion faces;
- a twenty-fourth linear portion comprising one end connected to the other end of the twenty-second linear portion and facing a seventh direction different from the sixth direction;
- a twenty-fifth linear portion comprising one end connected to the other end of the twenty-third linear portion and facing an eighth direction different from the sixth direction; and
- a twenty-sixth linear portion connecting the respective other ends of the twenty-fourth and twenty-fifth linear portions; and wherein the thirteenth linear portion and the twenty-second linear portion cross each other.

9. The amplifier according to claim 8,
wherein the linear portion of the third inductive line has:
- a thirtieth linear portion comprising one end connected to the second terminal of the third amplifying unit; and
- thirty-first linear portion comprising one end connected to the first terminal of the fourth amplifying unit; and wherein the bending portion of the third inductive line has:
- a thirty-second linear portion comprising one end connected to the other end of the thirtieth linear portion and facing a ninth direction different from a direction which the thirtieth linear portion faces;
- a thirty-third linear portion comprising one end connected to the other end of the thirty-first linear portion and facing a tenth direction different from a direction which the thirty-first linear portion faces;
- a thirty-fourth linear portion comprising one end connected to the other end of the thirty-second linear portion and facing an eleventh direction different from the tenth direction;
- a thirty-fifth linear portion comprising one end connected to the other end of the thirty-third linear portion and facing a twelfth direction different from the tenth direction; and
- a thirty-sixth linear portion connecting the respective other ends of the thirty-fourth and thirty-fifth linear portions; and wherein the twenty-third linear portion and the thirty-second linear portion cross each other.

10. The amplifier according to claim 3,
wherein the first to fourth inductive lines are arranged in a rectangular shape with the first to fourth power supply terminals being vertexes;
wherein the first to fourth amplifying units are arranged respectively in a middle portion between the first and second power supply terminals, a middle portion between the second and third power supply terminals, a middle portion between the third and fourth power supply terminals, and a middle portion between the fourth and first power supply terminals; and
wherein the respective bending portions of the first to fourth inductive lines have:
- a fortieth linear portion comprising one end connected to one of the first to fourth power supply terminals;
- a forty-first linear portion comprising one end connected to the other end of the fortieth linear portion and facing a thirteenth direction different from a direction in which the fortieth linear portion is disposed;
- a forty-second linear portion connecting the forty-first linear portion and one of the first to fourth amplifying units;
- a twentieth linear portion comprising one end connected to one of the first to fourth power supply terminals and facing a fourteenth direction different from a direction in which the seventeenth linear portion is disposed;
- a twenty-first linear portion comprising one end connected to the other end of the twentieth linear portion and facing a fifteenth direction different from the fourteenth direction; and a twenty-second linear portion connecting the twenty-first linear portion and the other amplifying units of the first to fourth amplifying units.

11. The amplifier according to claim 3, further comprising, a choke inductor arranged between at least the first inductive line and the first power supply terminal.

12. A radio, comprising:
a transforming unit converting an inputted signal into a signal having a frequency for communication; and
the amplifier according to claim 1 which amplifies the signal converted in the converting unit.

* * * * *